United States Patent
De Bhailis et al.

(10) Patent No.: US 7,126,443 B2
(45) Date of Patent: Oct. 24, 2006

(54) INCREASING PERFORMANCE OF PLANAR INDUCTORS USED IN BROADBAND APPLICATIONS

(75) Inventors: Diedre Anne De Bhailis, Passage West (IE); Bill Allen Keeney, Rylane (IE)

(73) Assignee: M/A-COM, Eurotec, B.V., Cork (IE)

( * ) Notice: Subject to any disclaimer, the term of this patent is extended or adjusted under 35 U.S.C. 154(b) by 102 days.

(21) Appl. No.: 10/456,224

(22) Filed: Jun. 6, 2003

(65) Prior Publication Data

US 2004/0189422 A1 Sep. 30, 2004

Related U.S. Application Data

(63) Continuation-in-part of application No. 10/403,343, filed on Mar. 28, 2003.

(51) Int. Cl.
*H03H 7/00* (2006.01)
(52) U.S. Cl. .................. 333/185; 333/167; 333/175
(58) Field of Classification Search ............. 333/185, 333/175, 167
See application file for complete search history.

(56) References Cited

U.S. PATENT DOCUMENTS

| | | | | |
|---|---|---|---|---|
| 4,075,591 A | * | 2/1978 | Haas | 336/200 |
| 4,201,965 A | * | 5/1980 | Onyshkevych | 336/180 |
| 4,622,627 A | * | 11/1986 | Rodriguez et al. | 363/37 |
| 4,849,721 A | * | 7/1989 | Matsuura | 333/174 |
| 5,032,810 A | * | 7/1991 | Kaneko et al. | 333/185 |
| 5,173,671 A | | 12/1992 | Wendler et al. | 333/185 |
| 5,777,277 A | * | 7/1998 | Inagawa | 174/265 |
| 6,069,397 A | * | 5/2000 | Cornett et al. | 257/531 |
| 6,114,937 A | * | 9/2000 | Burghartz et al. | 336/200 |
| 6,285,865 B1 | | 9/2001 | Vorenkamp et al. | 455/307 |
| 6,287,931 B1 | * | 9/2001 | Chen | 438/381 |
| 6,380,608 B1 | | 4/2002 | Bentley | 257/531 |
| 6,448,873 B1 | | 9/2002 | Mostov | |
| 6,466,122 B1 | | 10/2002 | Hasegawa et al. | |
| 6,590,473 B1 | | 7/2003 | Seo et al. | 333/185 |
| 6,734,767 B1 | * | 5/2004 | Vanoverschelde et al. | 333/214 |
| 6,847,282 B1 | | 1/2005 | Gomez et al. | 336/200 |
| 2002/0050626 A1 | * | 5/2002 | Onuma et al. | 257/531 |
| 2004/0189422 A1 | | 9/2004 | De Bhailis et al. | |
| 2005/0116802 A1 | | 6/2005 | Gomez et al. | |

FOREIGN PATENT DOCUMENTS

DE  39 42 509  6/1991

(Continued)

OTHER PUBLICATIONS

Brian C. Wadell, Transmission Line Design Handbook, (1991) Chapter 6, pp. 381-414, Artech House Inc., 685 Canton Street, Norwood, MA 02062.

(Continued)

*Primary Examiner*—Robert Pascal
*Assistant Examiner*—Kimberly Glenn

(57) ABSTRACT

Increasing performance of planar inductors used in broadband applications is described. In one implementation, an apparatus includes a high Quality factor (Q) value spiral planar inductor etched directly into a printed circuit board. A ferrite structure is attached to the printed circuit board and located in proximity to the high Q value spiral planar inductor. The ferrite structure increases the Q of spiral planar inductors, but without the inconvenience and expense of a wire wound terroidal inductors. Various shaped ferrite structures may be used in conjuction with the spiral planar inductors. Additionally, in certain implementations, the ferrite structures are configured to rotate about axis permitting the inductors to be tuned, even after components have been installed on a printed circuit board.

39 Claims, 7 Drawing Sheets

FOREIGN PATENT DOCUMENTS

| | | | |
|---|---|---|---|
| DE | 39 42 509 A1 | | 6/1991 |
| EP | 1 304 707 A2 | | 4/2003 |
| EP | 1 304 707 A3 | | 5/2003 |
| EP | 1 484 773 A1 | | 12/2004 |
| GB | 783549 | | 9/1957 |
| JP | 2001 202 489 | | 7/2001 |
| JP | 2004031520 | * | 1/2004 |

OTHER PUBLICATIONS

Patent Abstracts of Japan, vol. 2000, No. 24, Publication No. 2001202489, Publication Date, Jul. 27, 2001, Application Date Jan. 20, 2000, Application No. 2000011653.

De Bhailis et al., "High Q Planar Spiral Inductors for CATV Filter Applications" IMAPS 2001 Proceedings, May 30, 2001.

Mongia et al., "RF and Microwave Copulped-line Circuits," Boston Astech House 1999, pp. 372-383.

Keeney, B., "Applications for E-Series Componenets in Cable Modem Systems," M/A Com Loud and Clear, vol. 6, No. 1, Spring/Summer 1999.

Search report for De Bhailis et al., EP 1484773, citing references GB 783549 A, DE 3942509 A, EP 1304707 A, and JP 2001 202489 (attached herewith).

* cited by examiner

INCREASING PERFORMANCE OF PLANAR INDUCTORS USED IN BROADBAND APPLICATIONS

CROSS-REFERENCE TO RELATED APPLICATIONS

The present patent application is a continuation-in-part of U.S. patent application Ser. No. 10/403,343, entitled "Inductor Topologies and Decoupling Structures for Filters Used in Broadband Applications, and Design Methodology Thereof," by Keeney, et al. having a filing date of Mar. 28, 2003, and is commonly assigned herewith. The contents of the aforementioned application are fully incorporated herein by reference.

TECHNICAL FIELD

The present invention relates to filters and other components used in broadband applications.

BACKGROUND

"Broadband" generally refers to methodologies used to send and receive data over high-speed networks. Broadband, as opposed to narrowband, usually implies a bandwidth capability where there is voice quality movement of data. Broadband is commonly associated with, although not limited to, a way of connecting a local computer or other device to a high-speed network, such as the Internet.

Broadband connections, whether through cable, digital subscriber lines, optical, wireless, or satellites, typically involve the use of some type of interface module, such as a modem, for handling bi-directional transmissions of data. Many interface modules use various types of filters to remove information content such as high and/or low frequencies, for example. These filters usually include one or more high quality factor (Q) torroidal inductors. "Q" represents the efficiency of an inductor in terms of storing a magnetic field.

Torroidal inductors having high Q values are discreet parts typically fabricated by manually wrapping wires around ferromagnetic cores. Most automatic "pick-and-place" techniques are not available for torroidal inductors due to their fragile nature and the precision needed to wind and place wiring around ferromagnetic cores. Accordingly, the fabrication process is labor intensive and can lead to high manufacturing costs. There are also problems associated with correctly installing them on a printed circuit board, because automatic pick-and-place is not typically available. All these problems can lead to higher manufacturing costs.

Once inductors have been installed on a printed circuit board, it is very difficult, if not impossible, to effectively tune operating characteristics associated with the inductor, such as flux, Q values, and reactance. Thus, tuning of torroidal inductors is extremely limited after they are installed on a printed circuit board.

SUMMARY

Increasing performance of planar inductors used in broadband applications is described. In one implementation, an apparatus includes a high Quality factor (Q) value spiral planar inductor etched directly into a printed circuit board. A ferrite structure is attached to the printed circuit board and located in proximity to the high Q value spiral planar inductor.

The ferrite structure increases the Q of spiral planar inductors, but without the inconvenience and expense of wire wound torroidal inductors. Various shaped ferrite structures may be used in conjunction with the spiral planar inductors. Additionally, in certain implementations, the ferrite structures are configured to rotate about an axis permitting the inductors to be tuned, even after the inductors have been installed (i.e. embedded) on a printed circuit board.

BRIEF DESCRIPTION OF THE DRAWINGS

The detailed description is described with reference to the accompanying figures. In the figures, the left-most digit(s) of a reference number identifies the figure in which the reference number first appears.

DETAILED DESCRIPTION

Architecture

Figure 1A:
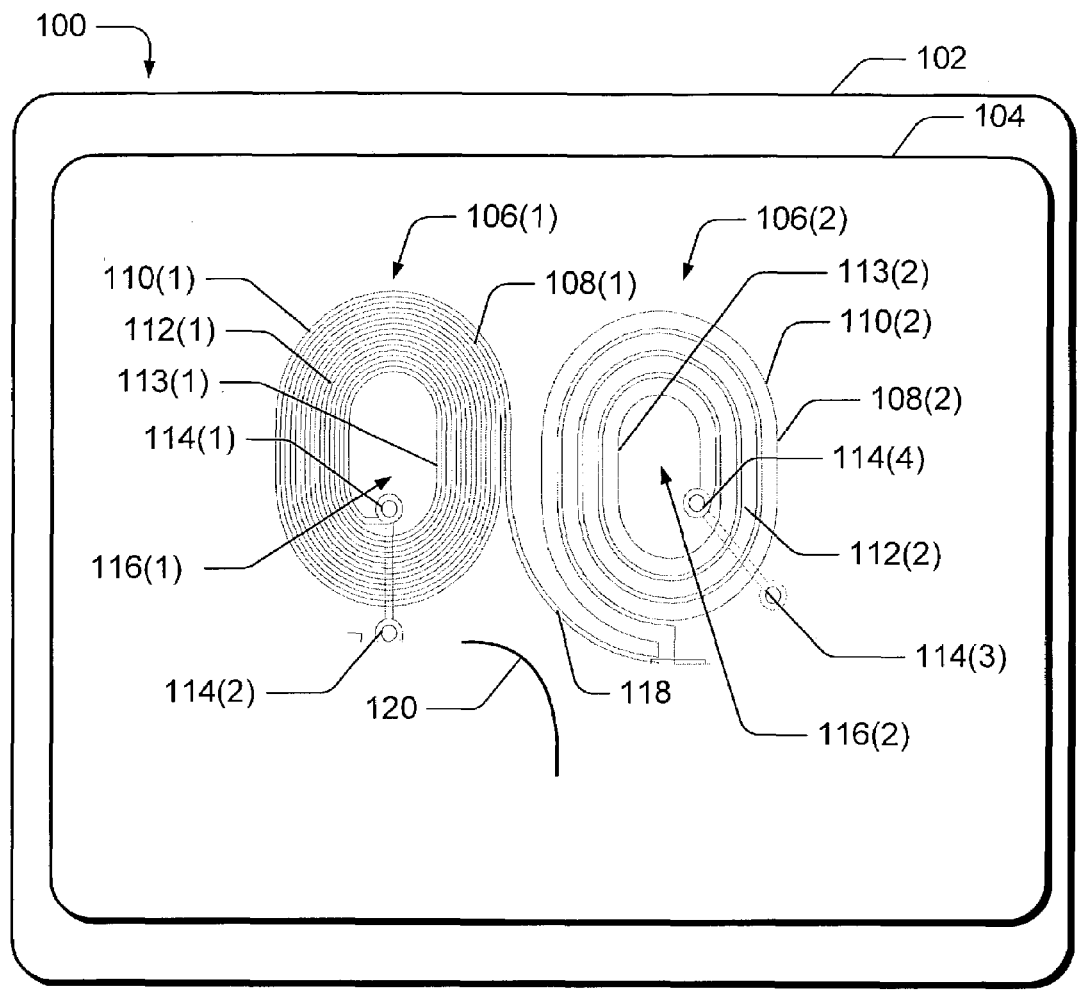
FIG. 1A shows an apparatus used in broadband applications.

FIG. 1A shows an apparatus 100 used in broadband applications. Apparatus 100 may be a broadband interface module used to connect two devices together in a broadband environment, such as subscriber device shown to the Internet. For example, apparatus 100 may be a set-top box, a cable television module, an optical modem, a DSL-based modem, and other related devices that operate in a broadband environment.

Apparatus 100 typically includes one or more printed circuit boards containing various circuits. In the exemplary illustration, apparatus 100 includes a printed circuit board 102 being an FR4 substrate circuit board. However, printed circuit board 102 may be another type of board used to connect circuits and chips. Printed circuit board 102 may be single sided, double sided, multi-level (layer), and capable of receiving other printed circuit boards. Additionally, the conductors used within the printed circuit board may contain copper, or other conductive materials.

Typically, contained on printed circuit board 102 is one or more filters 104 used to perform some type of input/output filtering operation involving some type of broadband application. For instance, filter 104 may be a diplexer, a duplexer, a tri-plexer, a high pass filter, a low pass filter and so forth. For example, filter 104 may operate in a range from about 1-to-1000 MHz, however, other ranges, greater or smaller, are possible.

Typically, contained within each filter 104 is one or more generally circular high Q value spiral planar inductors that are etched directly into the printed circuit board 102, configured to operate in a broadband environment. In the exemplary illustration, filter 104 includes two generally circular high Q value spiral planar inductors 106(1) and 106(2), referred to generally as inductors 106. As used herein, "generally circular" means a shape that is generally round such as a circle, rounded rectangles, racetrack shaped circles (e.g., an ellipse or oval), volute and other generally circular forms. Generally circular also includes objects that are planar, but deposed within the printed circuit board at different levels such as a helical spiral. Both inductors 106 used in this example are elliptical in shape.

Each inductor 106 includes generally circular conductive traces, generally referred to as reference number 108, that are etched directly into the printed circuit board 102. The conductive traces 108 are conductive tracks etched into a conductive layer of the printed circuit board 102. An outer most conductive trace (referred to generally as 110) for each inductor, wraps around inner conductive traces (referred to generally as 112) that form a spiral leading to an inner most conductive trace (referred to generally as 113). The inner most conductive trace 113 wraps around a center portion (referred to generally as 116) of the inductor, the center portion 116 having no conductive traces.

Each track (e.g. trace 108) may be monolithically deposited within the printed circuit board through a wide range of printed circuit board processing techniques. In the exemplary illustration, traces 108 are photo-etched into the printed circuit board 102, because photo-etching provides the capability to produce finer tracks and closer gaps. For example, it may be necessary to have gaps between the traces down to one 3000$^{th}$ of an inch, which generally involves some sort of photo-etching or equivalent process. Additionally, through photo-etching, it is possible to consistently and repetitively manufacture traces within strict dimensional tolerances.

In the exemplary illustration, inductors 106(1) and 106(2) are coupled together via a trace 118. Depending on the application, each inductor 106 may be connected to other components, such as capacitors (not shown in FIG. 1A), which may be discrete or parasitic. In such applications, each inductor may be configured to provide a self-resonant frequency for inductances of about 40 to 400 nH; however, other ranges greater or smaller are possible. Each inductor may be connected to ground or a current source through vias 114(1)–114(4) connected to the traces (i.e., winding) 108.

Generally circular high Q value planar spiral inductors are open structures, and therefore generate magnetic and electrical fields, which tend to travel through air and cross through conductive traces of adjacent spirals, modifying their inductances. Modification of inductances in turn effects the resonators (see FIG. 3 for an example of a resonator). This phenomena, referred to as "coupling" may significantly and adversely affect the performance of filters. Being able to compensate for these coupling effects is desirable.

Decoupling structures, such as a decoupling structure 120 shown in FIG. 1A can be used to reduce inter-filter and intra-filter coupling once the coupling effects are quantified. Decoupling structure 120 can be etched into the printed circuit board in proximity to the inductors 106 to reduce coupling. That is, decoupling structure 120 is configured to reduce unwanted electromagnetic coupling between the inductors 106 when current flows through them. The decoupling structure may embody any shape or size, but is generally minimized to reduce "real estate" needed on the printed circuit board 102. For example, decoupling structure 120 may be a narrow trace of conductive metal that is grounded or ungrounded. By positioning decoupling structure 120 near inductors 106, inductors 106 cause a current to flow in the decoupling structure 120, thereby generating a magnetic field having a sense of polarization opposite that of the magnetic fields generated by the inductors 106. Because, the magnetic field generated by the decoupling structure 120 opposes the magnetic field generated by the spiral inductors 106, the effects of intra-filter or inter-filter coupling are reduced.

Figure 1B:
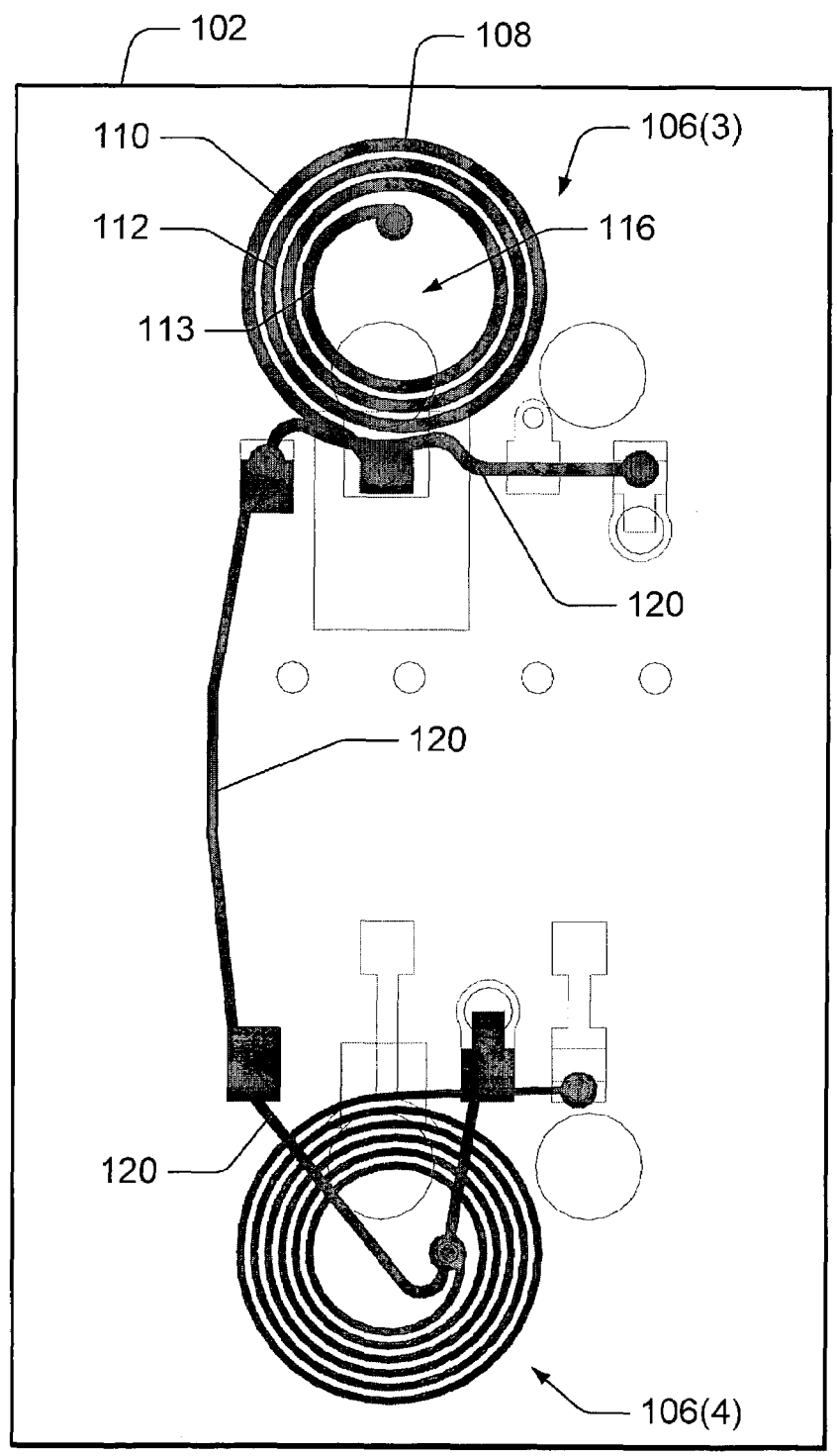
FIG. 1B shows two generally circular high Q value planar spiral inductors decoupled from one another by a decoupling structure.

FIG. 1B shows two generally circular high Q value planar spiral inductors 106(3) and 106(4) decoupled from one another by a decoupling structure 120. FIG. 1B also shows another view of conductive traces 108 that are etched directly into a printed circuit board 102. Referring to inductor 106(3) of FIG. 1B are circular conductive traces 108 that are etched directly into the printed circuit board 102. An outer most conductive trace 110 wraps around inner conductive traces 112 that form a spiral leading to an inner most conductive trace 113. The inner most conductive trace 113 wraps around a center portion 116 of inductor 106(3), the center portion 116 having no conductive traces.

Referring back to FIG. 1A, it is possible that other elements and components may be included in apparatus 100, including discrete parts. Different quantities of each of the components (greater or smaller) described above may also be included, such as using only a single generally circular high Q value spiral inductor or using more than two of the generally circular high Q value spiral inductors.

Figure 2:
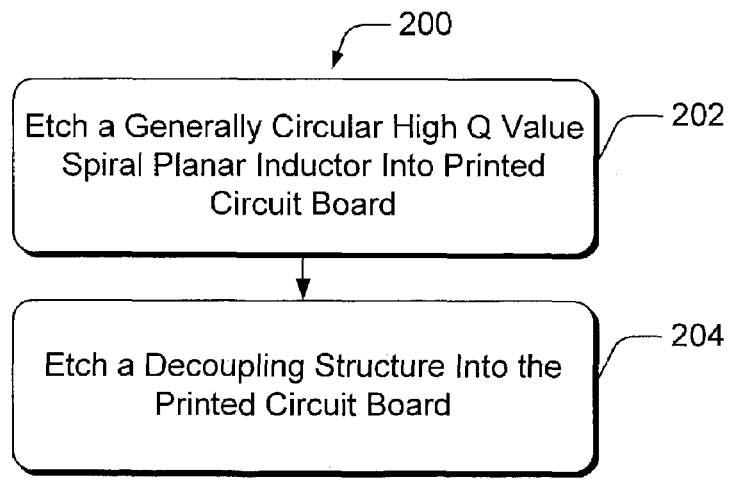
FIG. 2 is a method for making at least one high Q value spiral planar inductor and a decoupling structure such as the exemplary ones shown in FIG. 1.

FIG. 2 is a method 200 for making at least one high Q value spiral planar inductor and a decoupling structure such as the exemplary ones shown in FIGS. 1A and 1B. Method 200 includes blocks 202 and 204. The order in which the method is described is not intended to be construed as a limitation.

In block 202, a generally circular high Q value spiral planar inductor is etched into a printed circuit board. For example, an inductor 106 (FIGS. 1A and 1B) is etched into a printed circuit board 102 (FIG. 1A and 1B) using printed circuit board techniques, such as photo-etching. To further reduce the amount of space required by the inductors and optimize layout space, the generally circular inductors may be elliptical in shape, such as shown in FIG. 1A (as opposed to purely circular inductors as shown in FIG. 1B).

In block 204, a decoupling structure may be embedded in the printed circuit board in proximity to the spiral inductor to reduce magnetic coupling. For example, decoupling structure 120 may be etched into printed circuit board 102 in proximity to two inductors 106(1) and 106(2) (or 106(3) and 106(4)) to reduce coupling when current flows through the inductors 106. Quantifying coupling shall be described in greater detail below.

Figure 3:
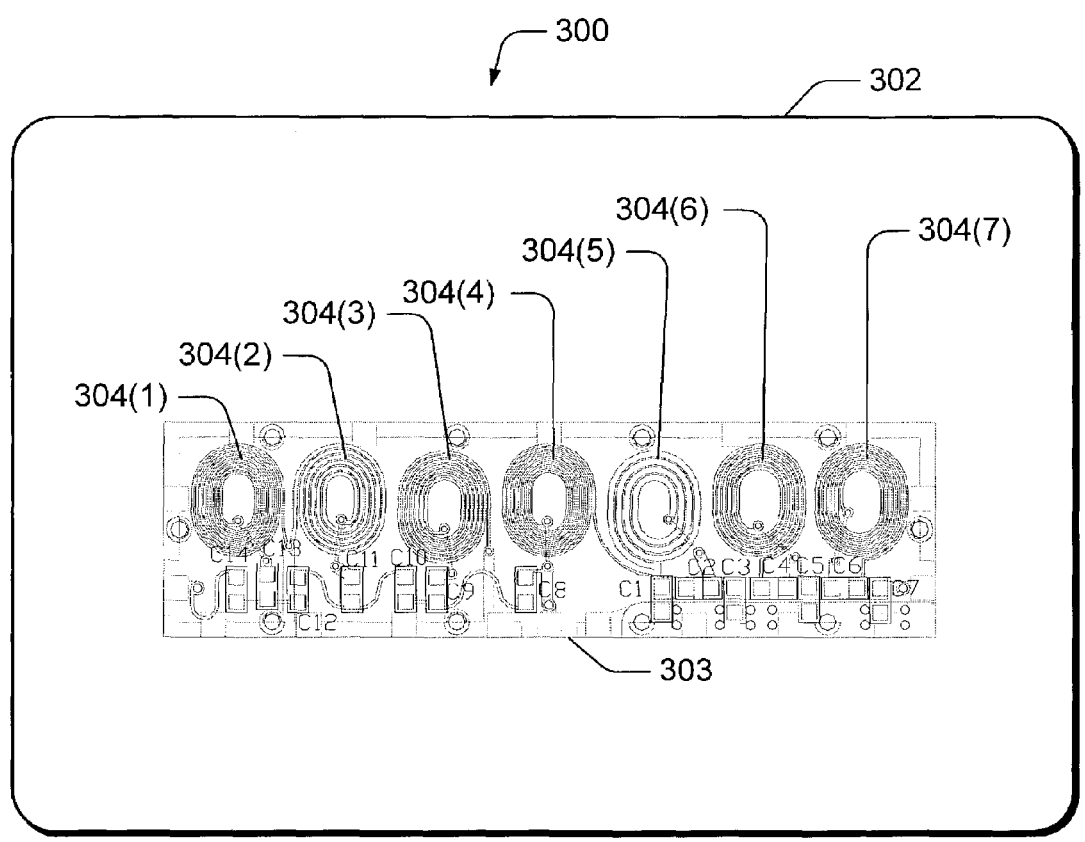
FIG. 3 shows an exemplary apparatus configured to operate as an interface module in a broadband environment.

FIG. 3 shows an exemplary apparatus 300 configured to operate as an interface module in a broadband environment. In particular, apparatus 300 is configured as a diplexer and includes a filter 302. Filter 302 includes generally circular high Q value spiral planar inductors 304(1)–304(7), embedded within a printed circuit board 303. Inductors 304(1), 304(2), and 304(3), along with capacitors C8–C14 make-up a high pass filter portion of the diplexer, whereas inductors 304(4)–304(7) along with capacitors C1–C7 make up a low pass filter portion of the diplexer. Resonator pairs are established between various inductors 304 and capacitor pairs in both the high pass and low pass filter sections. For instance, a least wound inductor 304(5), and capacitor C2, form a resonator pair, and inductor 304(6) and capacitor C4 form a resonator pair, and so forth. A metal cover (not shown) may also be included as a part of apparatus 300.

Design Methodology

To better identify coupling between spiral inductors, it is important to understand how a circuit that utilizes generally circular high Q value spiral planar inductors operates in a simulated environment prior to being etched into a printed circuit board. Unlike devices that use discrete inductors, it is difficult to tweak couplings between inductors once components have been placed onto a printed circuit board. That is why a spiral based filter design process may be used in connection with the introduction of any new filter design.

In one implementation, a design synthesis and optimization process includes synthesizing a particular filter design (such as the diplexer shown in FIG. 3) or other device/module either by hand or automatically by using software-based design synthesis package, such as the EAGLEWARE GENESYS design synthesis package. One or more generally circular high Q value spiral planar inductors are designed per the synthesized values as separate inductors in an electromagnetic (EM) simulator. Optionally, Z or S-parameter data blocks, which are generated by the EM simulator or manual measurement, may then be substituted into a lumped element model for subsequent simulation by the EM simulator.

Next, a suitable printed circuit board layout may be completed and imported into the EM simulator. This layout (i.e., the circuit layout) may then be EM simulated and the coupling (K) factors between the generally circular high Q value spiral planar inductors are extracted.

Next, the K factors are loaded into a new lumped element model and all of the inductive and capacitive elements of the filter or device are optimized. Thus, the design process allows the coupling between the generally circular high Q value spiral planar inductors to be quantified and compensated for.

Next, the circuit layout is modified according to the lumped element simulation results and a new EM simulation is performed. Decoupling structures, such as decoupling structure 120 shown in FIG. 1, can then be applied in the EM simulator to modify the K factors. Finally the design synthesis and optimization process is repeated until desired performance characteristics are achieved.

Figure 4:
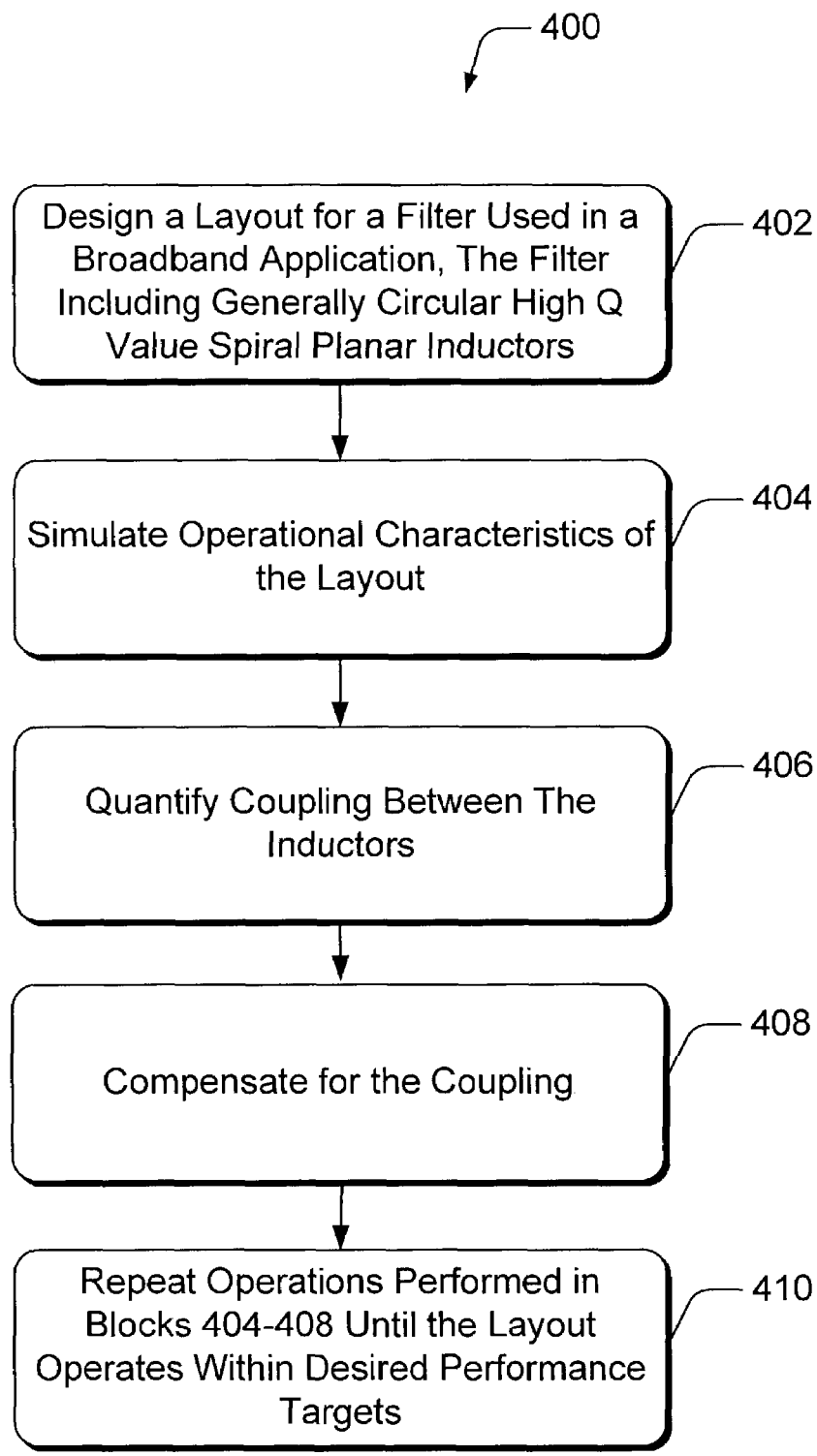
FIG. 4 shows an exemplary method for optimizing a design for making a filter used in a broadband application.

FIG. 4 shows an exemplary method 400 for optimizing a design for making a filter used in a broadband application. Method 400 exemplifies one embodiment of the design synthesis and optimization process described above. Method 400 is used in conjunction with the design of a filter that includes at least one generally circular high Q value spiral planar inductor. Method 400 includes blocks 402–410. The order in which the method is described is not intended to be construed as a limitation.

In block 402, a design layout for a filter (or other device) used in a broadband application is created. The filter includes one or more generally circular high Q value spiral planar inductors. For example, the filter may be a diplexer such as the one shown in FIG. 3. The design layout may be created manually or through the use of synthesis tools as described above.

In block 404, the layout is simulated to ascertain operational characteristics of the layout. For example, the layout may be EM tested and/or radio frequency tested. Optionally, Z-parameter or S-parameter data blocks may be substituted in the lumped element model that is either generated by the EM simulator or by manual measurements.

In block 406, once the circuit board layout is completed and imported into a simulator, coupling (K factors) between inductors are quantified.

In block 408, the couplings are compensated for by (i) introducing decoupling structures into the layout, (ii) changing inductor values for at least one of the generally circular high Q value spiral planar inductors, and/or (iii) modifying the layout.

In block 410, operations performed in blocks 404–408 are repeated until the layout operates within desired performance targets. For example, the K factors may be reloaded into a new lumped element model and all inductive and capacitive elements re-optimized. Then the circuit layout is modified according to the simulation results and then a new EM simulation is performed. This process may continue iteratively until desired simulated performance is achieved.

Higher Q Value Spiral Inductors

It is possible to introduce a ferrite structure in combination with any of the spiral planar inductors described above including any of the filters that may utilize a spiral planar inductor as described above. The ferrite structure is composed of a ferromagnetic material that serves to increase flux density and inductive reactance within a planar spiral inductor. Accordingly, the combination of increased flux and inductive reactance causes a substantial potential increase in Q associated with spiral planar inductors. In some instances, it has been observed that the Q value increases 50-to-60 percent. For example a planar spiral inductor without a ferrite structure may provide a Q of about 80 compared to a planar inductor with a ferrite structure that may provide a Q of about 125.

Accordingly, it may be advantageous to introduce a ferrite structure in conjunction with any of the inductors or devices described above to increase performance of such inductors/devices. The ferrite structure can be fastened to a printed circuit board using a wide variety of techniques currently used to attach components to printed circuit boards. For instance, in certain implementations it may be desirous to mount (i.e., glue, solder, screw, bolt, etc.) a ferrite structure on the printed circuit in proximity to the spiral planar inductors described above. As used herein "proximity to a spiral planar inductor" means adjacent to a spiral planar inductor, partially over a spiral planar inductor, partially under a spiral planar inductor, fully over a spiral planar inductor, fully under a spiral planar inductor, and/or encasing a spiral planar inductor in all three dimensions (through the center). Described in more detail below are several sample illustrations of how to implement a ferrite structure in combination with a spiral planar inductor.

Figure 5:
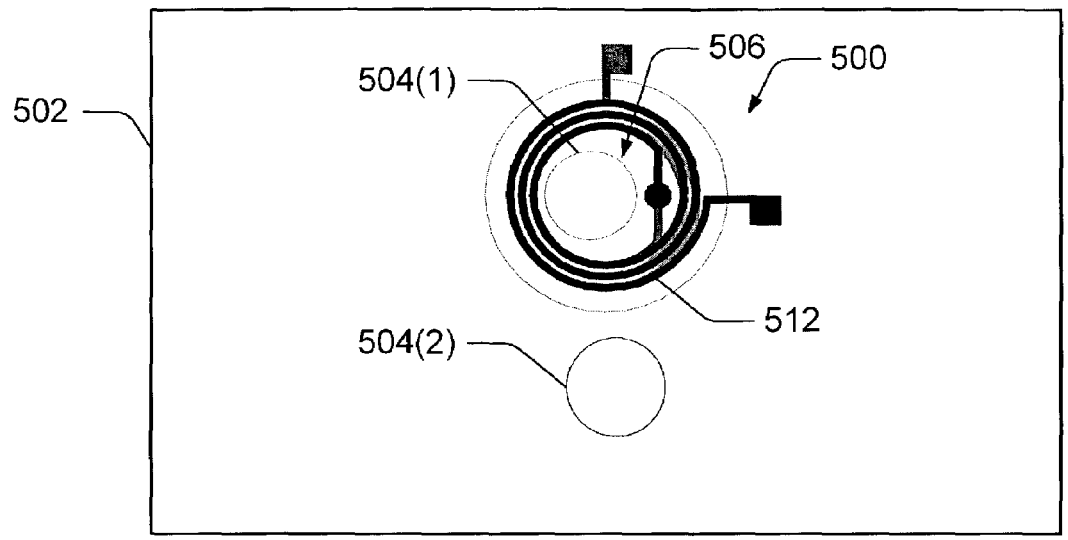
FIG. 5 is top view of a generally circular high Q value spiral planar inductor etched into a printed circuit board, showing a hole inserted in the center of the inductor to receive a ferrite structure.

FIG. 5 is top view of a generally circular high Q value spiral planar inductor 500 etched into a printed circuit board 502. Positioned in proximity to the generally circular high Q value spiral inductor is a hole 504(1) in the printed circuit board 502. As shall be explained, hole 504(1) provides a means to attach and secure a ferrite structure (shown in FIGS. 6–9 below) to the printed circuit board 502. In the ferrite that passes through the center of the spiral this is where the highest flux concentration occurs (center).

In one implementation, the hole 504(1) is positioned within a center portion 506 of the generally circular high Q value spiral inductor 500, where there are no conductive traces. That is, hole 504(1) is positioned within a non-conductive portion of generally circular high Q value spiral inductor 500 and passes completely through printed circuit board 502.

Alternatively, a hole 504(2) may be positioned exterior to the outer most traces 512 of generally circular high Q value spiral inductor. In either implementation, holes referred to generally as 504 do not necessarily have to pass completely through printed circuit board 502 and may only pass partially through a printed circuit board i.e., one or more layers of the printed circuit board. Holes generally referred to reference number 504 are generally circular in shape, but may be other circular and non-circular shapes including, but not limited to, ovals, squares, triangles, and so forth.

Figure 6:
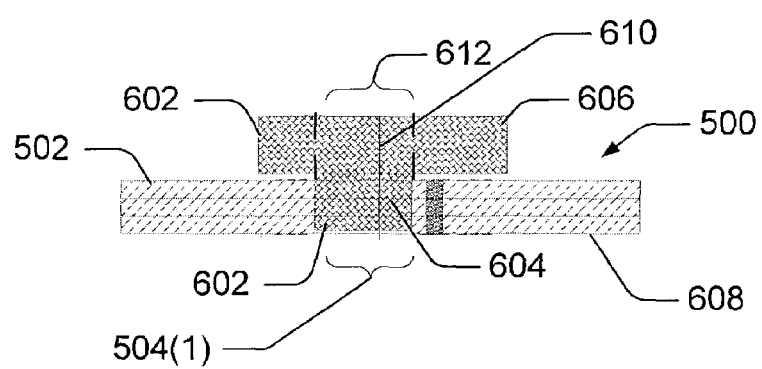
FIG. 6 is a cross-sectional view of the printed circuit board shown in FIG. 5 and a ferrite structure attached thereto.

FIG. 6 is a cross-sectional view of printed circuit board 502 shown in FIG. 5, with a ferrite structure 602 attached thereto. According to this exemplary implementation, ferrite structure 602 is attached to printed circuit board 502 via hole 504(1) (see also FIG. 5). Ferrite structure 602 is composed of a ferromagnetic material formulated to be low loss over a particular range of RF frequencies. For instance, the ferromagnetic material may be composed of ferrite or powdered iron material. In the exemplary illustration, ferrite structure 602 includes a post 604 and pedestal structure 606. Post 604 is configured to fit inside hole 504(1) and pedestal structure 606 is configured to reside outside hole 504(1).

In one implementation, post 604 is a column with a diameter slightly smaller than the diameter of hole 504(1). Post 604 provides stability for pedestal structure 606, and, serves as an axis point to rotate (i.e., turn in a clockwise or counter clockwise direction) pedestal structure 606, as shall be explained below (again the ferrite in the center gives the highest flux density and provides best performance short of the "cup" ferrite in FIG. 9. Once post 604 is inserted into hole 504(1), post 604, and hence ferrite structure 602, may be secured to printed circuit board 502 by glue, solder or other fastening means.

In one implementation, post 604 has a length that is slightly smaller than the total depth of hole 504(1). For instance if the total thickness of printed circuit board is 0.06 inches and hole 504(1) is equal to the thickness of the printed circuit board, then post 604 may be 0.055 inches, i.e., slightly shorter than the total depth of the hole. By being slightly shorter than or equal to the total depth of hole 504(1), post 604 is prevented from extending beyond the bottom side 608 of printed circuit board 502. This allows a surface mount type application (SMT) It should be noted that the aforementioned dimensions are illustrated for exemplary purposes only, as the actual sizes and shapes of various devices will change depending on the implementations. It should also be noted that "bottom" only refers to the position of the printed circuit board as illustrated in the FIGS., and could easily be interchanged for the top of the printed circuit board.

Alternatively, post 604 may be shaped differently than a column and have various diameters capable of fitting into hole 504(1). Additionally, post 604 may also be longer than the total depth of hole 504(1) and extend beyond the bottom side 608 of printed circuit board 602. The post 604 may also include notches (not shown) to secure the post to the printed circuit board 502. For plug-in type applications In one implementation, pedestal structure 606 and post 604 are integral, meaning they are a single unitary structure. Post 604 is generally perpendicular to pedestal structure 606. Alternatively, pedestal structure 606 and post 604 may be individual pieces connected together by some type of fastening means such as by inserting the post 604 into an optional hole 612 within pedestal structure 606.

Pedestal structure 606 is generally larger (but not necessarily) than holes 504(1) or 504(2) and is configured to fit over (i.e., cover) at least a portion of the generally circular high Q value spiral planar inductor 500. The portion may range from less than one percent to one hundred percent (100%) of the total area the generally circular Q value spiral planar inductor 500.

Figure 7:
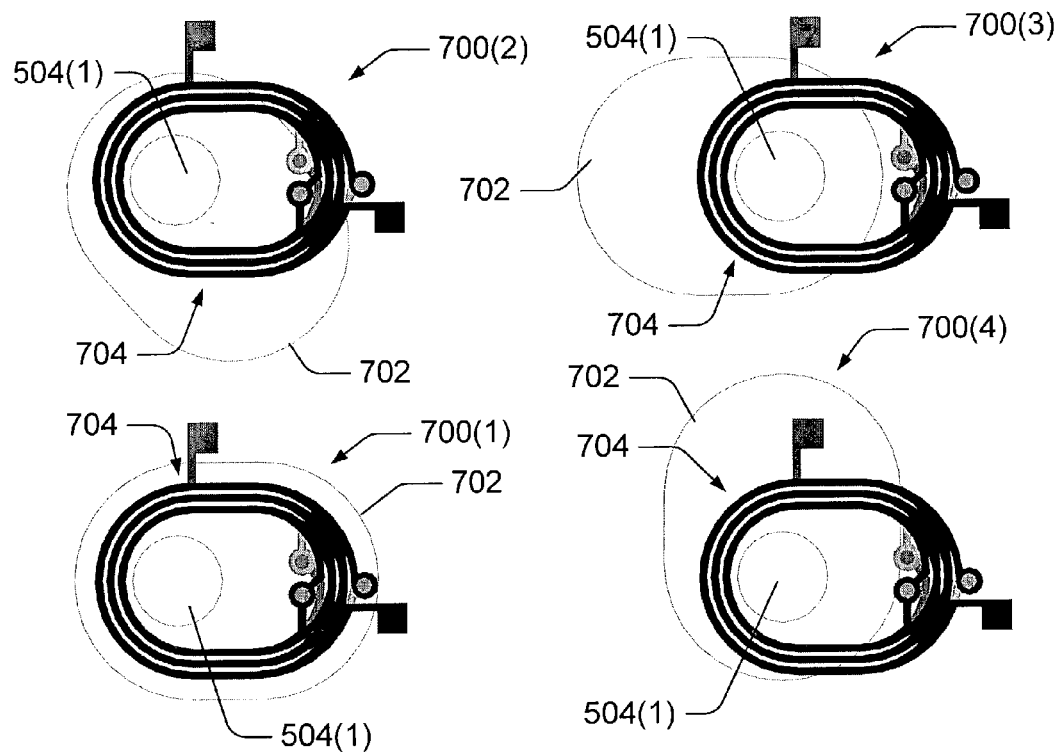
FIG. 7 shows four top views of a pedestal structure as it is rotated over a generally circular high Q value spiral planar inductor (to affect tuning).

Post 604 and pedestal structure 606 may be offset with respect to the center 610 of pedestal structure 606. This offset enables a greater variance in area of the planar spiral inductor covered by pedestal structure 606 when pedestal structure is rotated/twisted about an axis. For instance, FIG. 7 shows four top views 700(1), 700(2), 700(3) and 700(4) of a pedestal structure 702 as it is rotated over a generally circular high Q value spiral planar inductor 704. In the four views, pedestal structure 702 is implemented as a disk shaped object in the shape of an ellipse to compliment the elliptically shaped inductor 704, but may be implemented as other shaped objects including, but not limited to, a square, triangle and other various objects capable of rotating about an axis (e.g., post 604). Hole 504(1) is shown as the axis point for which pedestal structure 702 is rotated.

View 700(1) shows pedestal structure 702 covering one hundred percent (100%) of inductor 704, providing maximum coverage over inductor 704. View 700(2) shows the pedestal structure 702 rotated in a clockwise direction from view 700(1) and covering less than the entire inductor 700. View 700(3) shows pedestal structure 702 rotated further and now covering approximately fifty percent (50%) of inductor 700 or the minimum amount of coverage that pedestal structure can cover according to this implementation. It should be noted that if the hole in the printed circuit board was outside the inductor or a different shaped pedestal structure 702 was used, it might be possible to cover less than fifty percent of the inductor. Finally, view 700(4) shows pedestal structure 702 covering a percentage of inductor 704, somewhere between maximum coverage (view 700(1)) and minimum coverage (view 700(3)).

Thus, by rotating a pedestal structure about an axis (e.g., hole 504(1)) it is possible to tune a generally circular high Q value spiral planar inductor and change its Q and inductance values. This is particularly useful after components comprising a broadband filter are surface mounted on a printed circuit board. As explained with reference to the Background section above, tuning is difficult to nearly impossible once conventional components (torroidal inductors and capacitors) have been mounted on a printed circuit board. The aforementioned implementations, therefore, provide the ability to dynamically tune inductive characteristics, such as inductor reactance and Q, after the inductor is designed and etched into a printed circuit board.

It is appreciated that ferrite structures may be configured without a post as described above with reference to FIGS. 5–7. To reiterate, it is also appreciated that ferrite structures of various shapes and sizes may be attached to the printed circuit board without the use of a hole in the printed circuit board. For example, a ferrite structure can be attached directly to the printed circuit board by glue or other fastening means.

Figure 8:
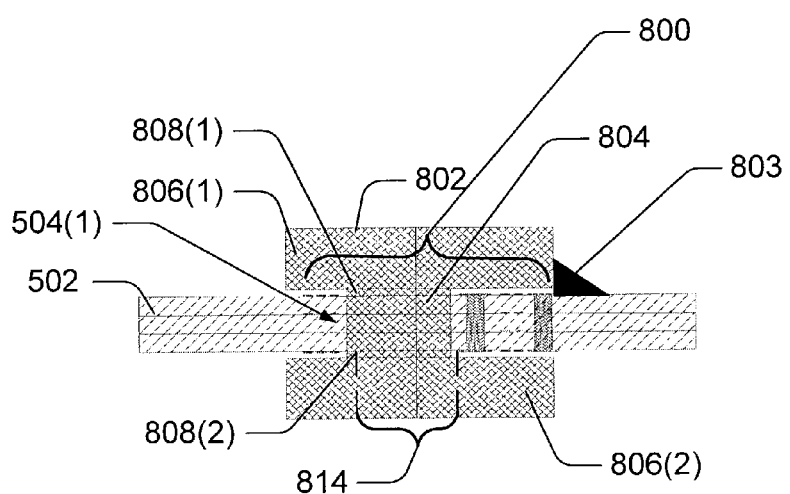
FIG. 8 is a cross sectional view of a printed circuit board with a ferrite structure in the shape of a bobbin attached thereto.

In certain implementations, it may be advantageous to increase Q values and reactance while simultaneously reducing coupling effects. This can be accomplished by enclosing more of a planar spiral inductor within a ferrite structure. For instance, FIG. 8 shows a cross sectional view of a printed circuit board 502 with a ferrite structure 802 in the shape of a bobbin attached thereto. Since an inductor 800 is essentially flat in this view, brackets represent the general location of the planar inductor 800. Inductor 800 can be any of the planar inductors described above.

In this implementation, ferrite structure 802 includes a post 804 and two pedestal structures 806(1) and 806(2) attached to post 804 at opposite ends 808(1) and 808(2). Post 804 passes completely through a hole 504(1) within printed circuit board 502. Either of pedestal structures 806(1) or 806(2) may be integrally connected to post 804 as a unitary structure or one or more of the structures may be attached to post 804. For example, pedestal structures 806(1) and/or 806(2) may include a hole 814 capable of receiving post 804. Pedestal structures 806(1) and 806(2) are positioned outside hole 504(1) and are parallel to one another. Post 804 is generally perpendicular to the pedestal structures 806(1) and 806(2). Accordingly, pedestal structures referred to generally as 806 thereby sandwich at least a portion of the generally circular high Q value spiral planar inductor 800 between the pedestal structures 806.

By sandwiching the generally circular high Q value spiral planar inductor 800, ferrite structure 802 concentrates greater flux within the inductor than ferrite structures shown in FIGS. 5–7. Additionally, ferrite structure 802 also provides greater protection against unwanted coupling from other components in proximity to the generally circular high Q value spiral planar inductor 800. Ferrite structure 802 may be held in place on the printed circuit by depositing glue or solder 803 between the printed circuit board 502 and ferrite structure 802.

Figure 9:
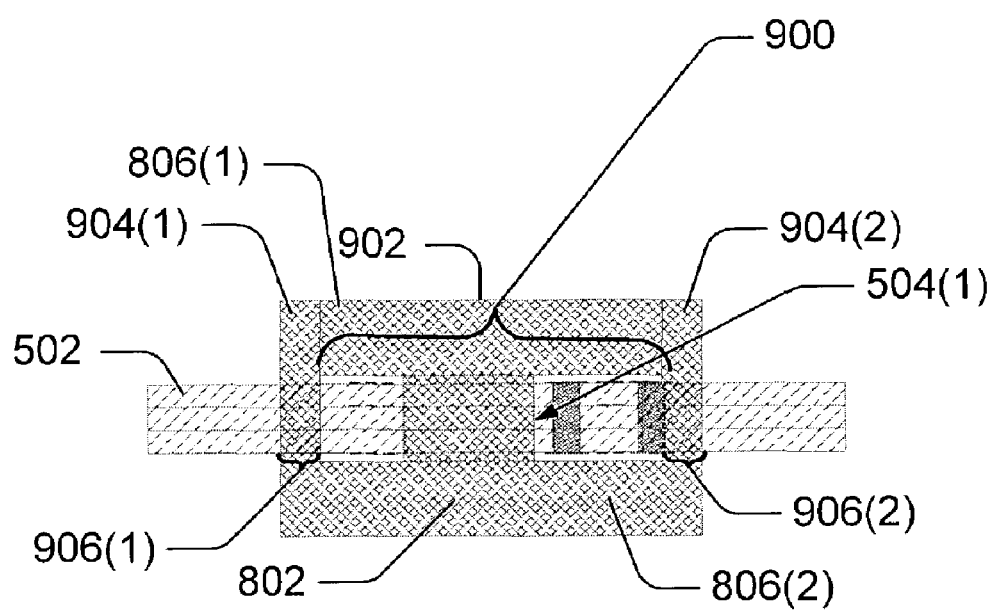
FIG. 9 is a cross sectional view of a printed circuit board and ferrite structure attached thereto, the ferrite structure configured to fully capture flux within a spiral planar inductor.

To provide even greater flux within a planar spiral inductor it is possible to completely enclose the inductor within a ferrite structure. For instance, FIG. 9 shows a cross section view of a printed circuit board 502 and ferrite structure 902 attached thereto, the ferrite structure 902 configured to fully capture flux within a spiral planar inductor 900 (since the inductor is planar in this view, brackets represent the general location of the planar inductor 900). Inductor 900 can be any of the planar inductors described above. Ferrite structure 902 includes ferrite structure 802 (shown in FIG. 8), but further includes end posts 904(1) and 904(2), which are also comprised of ferrite magnetic materials. End posts 904(1) and 904(2) are generally parallel to each other and are perpendicular to pedestal structures 806(1) and 806(2). In addition to hole 504(1) in printed circuit board 502 there are two holes 906(1) and 906(2) through printed circuit board 502. Holes 906(1) and 906(2) provide a means to receive and insert end posts 904(1) and 904(2), respectively. In this exemplary implementation, the generally circular spiral inductor 900 is sandwiched between pedestal structures 806(1) and 806(2) and end posts 904(1) and 904(2). Thus, the generally circular high Q value spiral planar inductor 900 is encased by ferrite structure 902.

Although some implementations of the various methods and arrangements of the present invention have been illustrated in the accompanying Drawings and described in the foregoing Detailed Description, it will be understood that the invention is not limited to the exemplary aspects disclosed, but is capable of numerous rearrangements, modifications and substitutions without departing from the spirit of the invention as set forth and defined by the following claims.

What is claimed is:

1. An apparatus, comprising:
a printed circuit board;
a high Quality factor (Q) value spiral planar inductor etched directly into a said printed circuit board; and
a ferrite structure attached to the printed circuit board and located in proximity to the high Q value spiral planar inductor and mounted within a hole in said printed circuit board;
wherein said ferrite structure comprises a post portion mounted within said hole in said printed circuit board and a disk portion suspended from said post portion above said high Q value spiral planar inductor on said printed circuit board, said ferrite structure configured to rotate about an axis defined by said post.

2. The apparatus as recited in claim 1, wherein the ferrite structure increases the Q value of the high Q value spiral planar inductor.

3. The apparatus as recited in claim 1, wherein the disk portion is configured relative to the post such that the rotation of the ferrite structure alters the portion of the high Q spiral inductor above which the disk portion of the ferrite is suspended.

4. The apparatus as recited in claim 1 wherein a center of the disk portion is offset from a center of the post portion such that rotation of the ferrite about the axis of the post portion alters the portion of the high Q value spiral planar inductor above which the disk portion is suspended.

5. The apparatus of claim 1 wherein the hole and the post are positioned inside of the high Q value spiral planar inductor.

6. An apparatus, comprising: a filter configured to operate in a broadband application, comprising:
a generally circular high Quality factor (Q) value spiral planar inductor etched directly into a printed circuit board;
a hole positioned within one or more layers of the printed circuit board; and
a ferrite structure positioned within at least a portion of the hole;
wherein the ferrite structure includes a post connected to a pedestal structure, wherein the post is configured to fit inside the hole and the pedestal structure is configured to reside outside the hole.

7. The apparatus as recited in claim 6, wherein the ferrite structure concentrates flux in the generally circular high Q value spiral planar inductor.

8. The apparatus as recited in claim 6, wherein the ferrite structure does not include wire wrappings.

9. The apparatus as recited in claim 6, wherein the ferrite structure includes a post and pedestal structure, wherein the post is configured to fit inside the hole and the pedestal structure is configured to reside outside the hole and over at least a portion of the generally circular high Q value spiral planar inductor.

10. The apparatus as recited in claim 6, wherein the ferrite structure includes a post and pedestal structure integrally connected to each other, wherein the post is a column configured to fit inside the hole and fasten the ferrite structure to the printed circuit board, and the pedestal structure is a disk shaped structure larger than the hole configured to extend over at least a portion of the generally circular high Q value spiral planar inductor.

11. The apparatus as recited in claim 6, wherein the ferrite structure includes a post and pedestal structure, wherein the post is configured to fit inside the hole and the pedestal structure is a disk shaped structure attached to the post and is larger than the hole.

12. The apparatus as recited in claim 6, wherein the ferrite structure includes a post and two pedestal structures attached to the post at opposite ends of the post, with the post positioned substantially inside the hole and the pedestal structures positioned outside the hole, wherein the pedestal structures are larger than the hole, thereby sandwiching at least a portion of the generally circular high Q value spiral planar inductor between the pedestal structures.

13. The apparatus as recited in claim 6, further including second and third holes through the printed circuit board, wherein the ferrite structure includes (i) a post and two pedestal structures attached to the post at opposite ends of the post with the post positioned inside the hole and the pedestal structures outside the hole; and (ii) first and second end posts parallel to the post and perpendicular to the two pedestal structures, wherein the first end post passes through the second hole and the second end post passes through the third hole, the first and second end posts are both attached to the two pedestal structures such that the generally circular high Q value spiral planar inductor is sandwiched between the two pedestal structures and also sandwiched between the first and second posts, thereby substantially encasing the generally circular high Q value spiral planar inductor.

14. The apparatus as recited in claim 6, wherein the apparatus is a broadband interface module.

15. The apparatus as recited in claim 6, wherein the apparatus is a cable television module.

16. The apparatus as recited in claim 6, wherein the apparatus is an input and/or output filter.

17. The apparatus as recited in claim 6, wherein the apparatus is one of at least a diplexer, duplexer, and triplexer.

18. The apparatus as recited in claim 6, wherein the generally circular high Q value spiral planar inductor is elliptical in shape.

19. The apparatus as recited in claim 6 wherein a center of the pedestal is offset from a center of the post such that rotation of the ferrite about the axis of the post alters the portion of the high Q value spiral planar inductor above which the pedestal is suspended.

20. The apparatus of claim 19 wherein the hole and the post are positioned inside of the high Q value spiral planar inductor.

21. An apparatus, comprising:
a printed circuit board;
a filter, operable in a broadband communication interface application; the filter comprising a high Quality factor (Q) value spiral planar inductor having generally circular conductive traces etched directly into the printed circuit board, wherein an outer most conductive trace wraps around inner conductive traces that form a spiral leading to an inner most conductive trace, wherein the inner most conductive trace wraps around a center portion of the inductor, the center portion having no conductive traces; and
a ferrite structure fastened to the printed circuit board and covering at least a portion the high Q value spiral inductor;
wherein the printed circuit board includes a hole passing through one or more layers of the printed circuit board, the hole positioned within the center portion of the high Q value spiral inductor, and the ferrite structure is fastened to the printed circuit board via the hole.

22. The apparatus as recited in claim 21, wherein the printed circuit board includes a hole passing through one or more layers of the printed circuit board and positioned within the center portion of the high Q value spiral inductor.

23. The apparatus as recited in claim 21, wherein the ferrite structure does not include wire wrappings.

24. The apparatus as recited in claim 21, wherein the printed circuit board includes a hole passing through one or more layers of the printed circuit board, the hole positioned within the center portion of the high Q value spiral inductor, and the ferrite structure includes a post that fits into the hole and provides a means to fasten the ferrite structure to the printed circuit board.

25. The apparatus as recited in claim 21, wherein the printed circuit board includes a hole passing through one or more layers of the printed circuit board and positioned within the center portion of the high Q value spiral inductor, and the ferrite structure includes a post that fits into the hole and provides a means to fasten the ferrite structure to the printed circuit board, the post having a smaller diameter than the hole.

26. The apparatus as recited in claim 21, wherein the ferrite structure includes a pedestal structure, wherein the pedestal structure is configured to cover at least the portion of the high Q value spiral inductor.

27. The apparatus as recited in claim 21, wherein the ferrite structure includes a post and pedestal structure integrally connected to each other, wherein the post is a column configured to fit inside a hole located through the printed circuit board and positioned within the center portion, and the pedestal structure is a disk shaped structure larger than the hole configured to fit over at least a portion of the high Q value spiral planar inductor.

28. The apparatus as recited in claim 27 wherein a center of the pedestal is offset from a center of the post such that rotation of the ferrite about the axis of the post alters the portion of the high Q value spiral planar inductor above which the pedestal portion is suspended.

29. The apparatus of claim 28 wherein the hole and the post are positioned inside of the high Q value spiral planar inductor.

30. The apparatus as recited in claim 21, wherein the ferrite structure includes a post and two pedestal structures attached to the post at opposite ends of the post, with the post positioned substantially inside a hole located through the printed circuit board and positioned within the center portion, the pedestal structures positioned outside the hole and parallel to each other sandwiching at least a portion of the high Q value spiral planar inductor between them.

31. The apparatus as recited in claim 21, wherein the generally circular conductive traces form an ellipse.

32. The apparatus as recited in claim 21, wherein the conductive traces are spaced apart from each other.

33. The apparatus as recited in claim 21, wherein the filter comprises a plurality of the high Quality factor (Q) value spiral planar inductors.

34. A diplexer, comprising:
a high pass filter and lower pass filter each comprising at least one high Quality factor (Q) value spiral planar inductor etched onto a printed circuit board; wherein the high Q value spiral planar inductor includes conductive traces etched directly into the printed circuit board forming an ellipse, wherein an outer most conductive trace wraps around inner conductive traces that form a spiral leading to an inner most conductive trace, wherein the inner most conductive trace wraps around a center portion of the inductor, the center portion having no conductive traces and bearing a hole, the high Q value spiral planar inductor further including a ferrite structure mounted to the printed circuit board, wherein the ferrite structure includes a post connected to a pedestal structure, and wherein the post is configured to fit inside the hole and the pedestal structure is configured to reside outside the hole.

35. A ferrite structure, comprising:

a pedestal structure; and a post perpendicular to and connected to the pedestal structure, both the pedestal and post composed of a ferromagnetic material, wherein the ferrite structure is for use specifically with a high Quality factor (Q) value spiral planar inductor etched directly into a printed circuit board, wherein the center of the pedestal is offset from the center of the post.

36. The ferrite structure as recited in claim 35, wherein the pedestal structure and the post are integrally connected to each other.

37. The ferrite structure as recited in claim 35, wherein the pedestal structure includes a hole to engage the post when the post is inserted in the hole thereby attaching the pedestal structure to the post.

38. The ferrite structure as recited in claim 35, wherein the pedestal structure is configured as a disk and includes a hole to engage the post when the post is inserted in the hole, the hole offset from a center point of the disk.

39. The ferrite structure as recited in claim 35, further including an opposing pedestal structure connected to the post opposite and parallel to the pedestal structure, wherein the pedestal structure, post and opposing pedestal structure collectively form a bobbin-shaped structure.

* * * * *